United States Patent
Menna et al.

(10) Patent No.: US 6,239,668 B1
(45) Date of Patent: May 29, 2001

(54) RF BALUN AND TRANSFORMER WITH SHUNT COMPENSATION TRANSMISSION LINE

(75) Inventors: Rudolph Menna, Harleysville; Philip Miguelez, Warminster, both of PA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/291,750

(22) Filed: Apr. 14, 1999

(51) Int. Cl.7 ................................................ H03H 11/32
(52) U.S. Cl. ................................................. 333/25; 333/32
(58) Field of Search .......................... 333/25, 32; 343/889

(56) References Cited

U.S. PATENT DOCUMENTS

| | | | |
|---|---|---|---|
| 2,921,275 | 1/1960 | O'Donovan | 333/28 R |
| 3,274,520 | 9/1966 | Eddy et al. | 333/127 |
| 3,500,252 | 3/1970 | Wakker | 333/131 |
| 3,783,415 | 1/1974 | Koskinen | 333/25 |
| 3,882,432 | 5/1975 | Bowman et al. | 333/32 |
| 4,717,896 | 1/1988 | Graham | 333/25 |
| 4,945,317 * | 7/1990 | Sato et al. | 333/25 X |
| 5,416,451 | 5/1995 | Kaltenecker et al. | 333/25 |
| 5,495,212 | 2/1996 | DeCramer | 333/25 |
| 5,592,133 * | 1/1997 | Kawana | 333/25 |
| 5,619,172 * | 4/1997 | Reynolds | 333/25 |
| 5,767,754 | 6/1998 | Menna | 333/25 |

OTHER PUBLICATIONS

Lefferson, Twisted Magnet Wire Transmission Line, *IEEE Transactions on Parts, Hybrids, and Packaging,* vol. PHP–7, No. 4, Dec. 1971, pp. 148–154.

Broxon II et al., Twisted–Wire Transmission Lines—RF Transmission Lines,—*RF Design,* Jun. 1990, pp. 73–75.

Krauss et al., Designing Toroidal Transformers to Optimize Wideband Performance, *Electronics,* Aug. 16, 1973, pp. 113–116.

\* cited by examiner

*Primary Examiner*—Benny Lee
(74) *Attorney, Agent, or Firm*—Volpe and Koenig, P.C.

(57) ABSTRACT

The RF transformer of the present invention couples a transmission line between a magnetic transformer and a balun. The location and function of the transmission line improves frequency response across a wide operational bandwidth by permitting the circuit to be tuned, thereby providing a greater degree of impedance matching.

14 Claims, 4 Drawing Sheets

RF BALUN AND TRANSFORMER WITH SHUNT COMPENSATION TRANSMISSION LINE

BACKGROUND OF THE INVENTION

1. Field of the Invention

This invention relates generally to broadband impedance matching transformers. More particularly, the invention relates to high impedance broadband transmission line transformers which exhibit low insertion loss, minimum voltage standing-wave ratios and provide a tuning network between balanced and unbalanced circuits.

2. Description of the Related Art

Transmission lines are used to connect various radio frequency circuit elements including connections from radio frequency (RF) circuits to antenna systems. Typical RF engineering practice dictates that a signal source should have an impedance equal to the impedance of the load. In addition, a load coupled to a transmission line should present an impedance equal to the characteristic impedance of the transmission line.

The importance of a matched load is that a transmission line terminated with a load equal to its characteristic impedance will transfer a signal without reflection. In that instance, all power contained in the signal is transferred from the transmission line to the load. Loads with a resistance unequal to the characteristic transmission line impedance produce reflections.

Short sections of transmission lines can be used to tune a mismatched load by inserting the section across the conductors as a shunt, or in series with the mismatched line. The length of the transmission line, the type of termination, (open or shorted), and its location determine the effect on the circuit. At very short wavelengths, transmission lines function as circuit tuning elements.

One application of a matching network would be employed at the output of an RF signal amplifier. A typical push-pull RF amplifier output stage would require an output transformer with a center tap for carrying equal, direct currents through each half of the primary winding to the transistors. The secondary winding provides a balanced output at a different impedance for conversion to an unbalanced line and for further circuit connection. A matched load is therefore essential to maximize power transfer.

A balun (BALanced-UNbalanced) is a passive device which permits a transition between an unbalanced circuit and a balanced circuit and also permits impedance matching if necessary. The balun provides electrical isolation, but passes the transmission line currents. Baluns avoid the high frequency limitations of conventional magnetic transformers since the windings are arranged such that winding capacitance and inductance form a transmission line free of resonances. Baluns can also provide impedance transformations with excellent broadband performance.

A prior art network converting a balanced output to an unbalanced output including an intermediate filtering network is disclosed in U.S. Pat. No. 5,495,212. However, the intermediate filtering network revealed does not perform a tuning function for the equivalent circuit; the network provides low-pass filtering.

While the prior art has shown impedance matching transmission line transformers using a combination of external devices incorporating intermediate filtering, the conventional devices are overly complex when designed to operate over a wide RF bandwidth. What is needed is a balanced-to-unbalanced transmission line transformer that permits tuning of the overall frequency response characteristics of the circuit.

SUMMARY OF THE INVENTION

The balanced-to-unbalanced broadband RF transmission line transformer of the present invention couples a twisted-wire transmission line between a center-tapped magnetic transformer and a balun. The location and function of the twisted-wire transmission line improves frequency response across a wide operational bandwidth by permitting the circuit to be tuned; thereby providing a greater degree of matching. The invention significantly improves frequency response over a 50–860 MHz operational bandwidth, while providing a conversion from a balanced to an unbalanced circuit with a high (4:1) impedance ratio. The RF transformer exhibits a low voltage standing wave ratio (VSWR) with a minimal circuit burden.

Accordingly, it is an object of the present invention to provide a transmission line transformer that converts balanced inputs which are 180° out of phase with each other to an unbalanced circuit while performing circuit tuning using a compensation transmission line to equalize the response characteristics over a large bandwidth.

Other objects and advantages will become apparent to those skilled in the art after reading the detailed description of a presently preferred embodiment.

DETAILED DESCRIPTION OF THE PREFERRED EMBODIMENT

Figure 1:
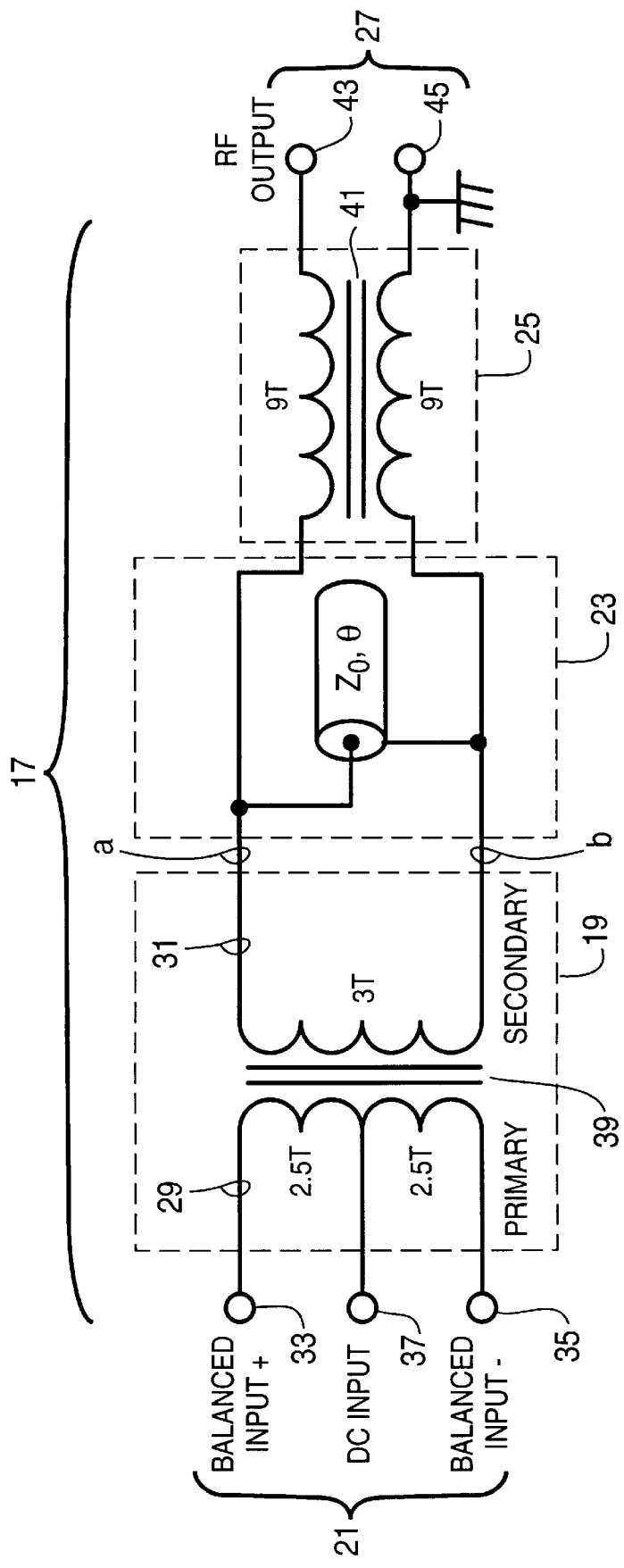
FIG. 1 is an electrical schematic of the preferred embodiment of the RF transformer.

The preferred embodiment will be described with reference to the drawing figures where like numerals represent like elements throughout.

Referring to the electrical schematic of FIG. 1, the preferred embodiment of the RF transformer 17 is shown. The RF transformer 17 includes three discrete sections: 1) a center-tapped magnetic transformer 19; 2) a twisted-wire compensation transmission line 23; and 3) a balun 25.

The first section of the RF transformer 17 is a center-tapped magnetic transformer 19 with balanced primary input terminals 21 and secondary output nodes a and b. Nodes a and b are coupled to the second section, the twisted-wire compensation transmission line 23. The compensation transmission line 23 is shunted across nodes a and b and has a calculated variable characteristic impedance $Z_0$ and an electrical length. The output of the magnetic transformer 19, (nodes a and b), is also coupled to the third section, the 1:1 balun 25. The balun 25 converts the balanced output a and b of the magnetic transformer 19 to an unbalanced RF output 27.

The physical construction of the magnetic transformer 19 and the balun 25 determines the characteristic inductance and capacitance of the RF transformer 17 and also determines the overall frequency response. The common mode inductance, or the primary inductance for a magnetic coupled transformer, determines the low frequency response of a transformer. Frequencies above the low frequency limit are coupled through the transformer core 39 and are unaffected by the common mode inductance. The high frequency limit is determined by transformer winding length and parasitic capacitance introduced by the common mode inductance.

In the preferred embodiment 17, the magnetic transformer 19 has a center-tapped primary 29 with five (5) turns and a balanced secondary 31 output having three (3) turns. A wire gauge of 36 AWG (American Wire Gauge) is used to form the primary 29 and secondary 31 around ferrite core 39. The input 21 is balanced across the primary positive 33 and negative 35 input terminals with the center tap terminal 37 providing a common voltage supply for the balanced input 21. The input 21 is typically connected to a push-pull amplifier output stage (not shown).

The balun 25 is preferably wound with nine (9) turns of 38 AWG on a separate ferrite core 41. The output 27 of the balun 25 is unbalanced with a positive terminal 43 and a signal common (earthed) terminal 45.

The compensation transmission line 23 is constructed of twisted magnetic 36 AWG wire having a film insulation. As one skilled in this art would appreciate, the insulation may vary in thickness among four groups. A wide variety of characteristic impedances can be accomplished by varying the wire diameter, number of twists per inch, length, insulation film thickness and insulation film type. In the preferred embodiment, the compensation transmission line 23 is constructed of 36 AWG magnet wire, 0.5 inch in length, with sixteen (16) twists per inch.

The characteristic impedance, $Z_0$, of the compensation transmission line 23 equals the ratio of voltage to current. The characteristic impedance of the preferred embodiment is 41 Ω. This characteristic impedance can also be expressed as the series wire inductance and inter-wire capacitance distributed along the length of the compensation transmission line 23. These relationships are well known to those skilled in the art of electronics. The result:

$$Z_0 = \sqrt{\frac{L}{C_t}} \quad \text{Equation (1)}$$

where $Z_0$ equals the characteristics impedance, L equals the parallel-wire inductance and $C_t$ equal the total inter-wire capacitance.

Figure 2:
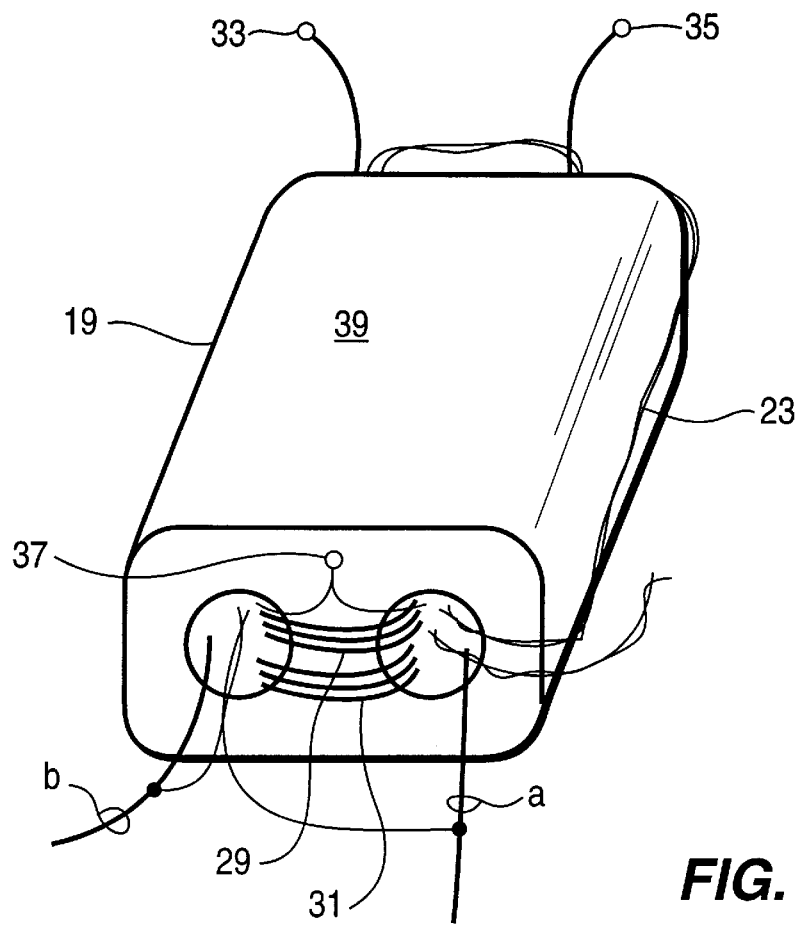
FIG. 2 is a perspective view of the magnetic transformer.

As shown in FIG. 2, the present invention 17 inside an amplifier preferably locates the compensation transmission line 23 within the ferrite core 39 of the magnetic transformer 19. The placement of the compensation transmission line 23 within the ferrite core 39 further provides a solid form around which to wrap the compensation transmission line 23 and keep it held in place. This ensures that the physical parameters of the compensation transmission line 23 will be the same for all manufactured units, and that the compensation transmission line 23 will not be inadvertently displaced once the RF transformer 17 leaves the manufacturing plant.

Figure 3:
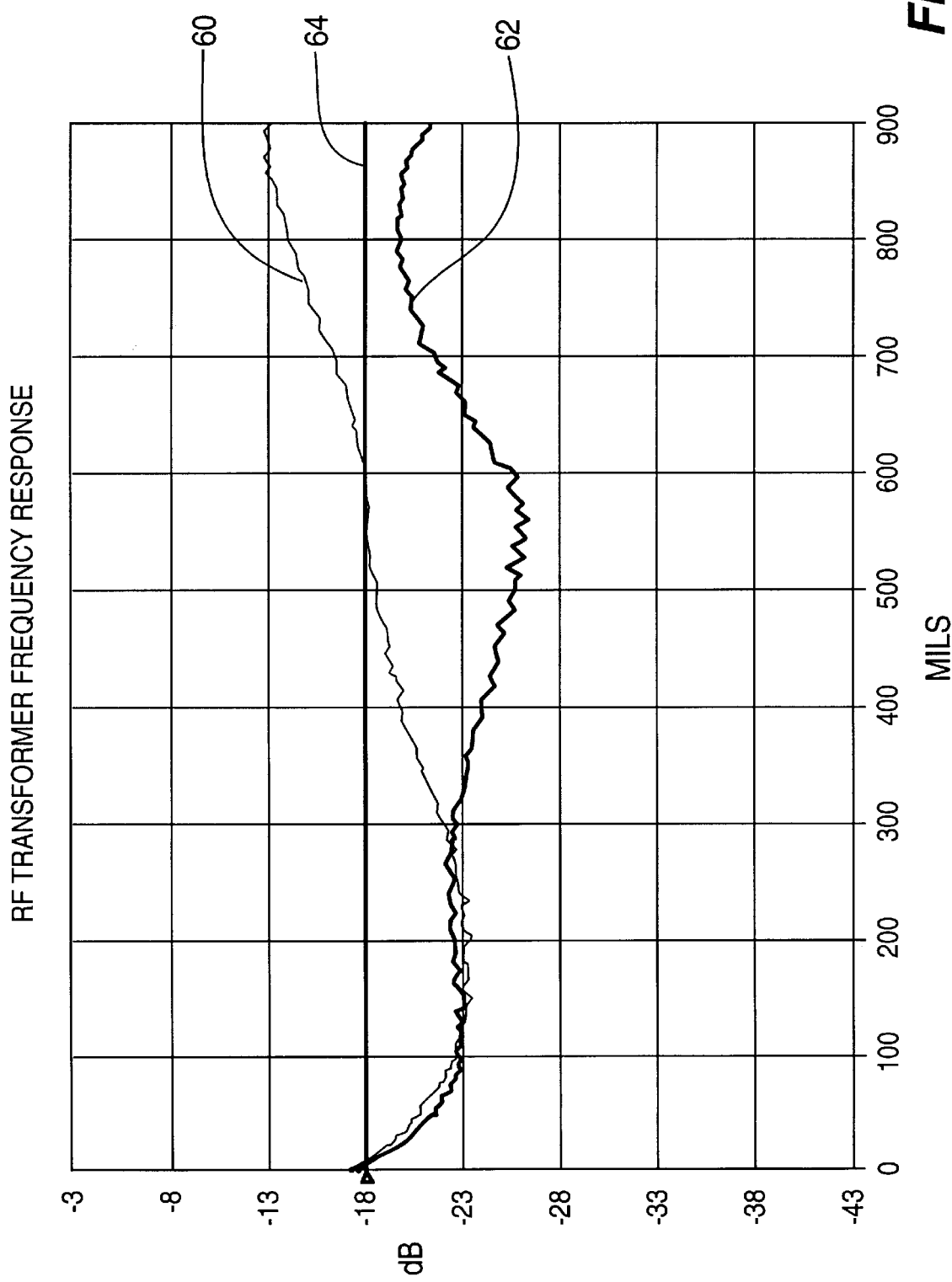
FIG. 3 is a plot of the frequency response of the RF transformer over the operational bandwidth both with and without the compensation transmission line.

A plot of the frequency response of the RF transformer 17 inside an RF amplifier with and without the compensation transmission line 23 is shown in FIG. 3. For the present invention, it was desired to limit the amplifier return loss to less than −18 dB. The input RF signal is a sinusoid which sweeps over a 0–900 MHz bandwidth. As shown, the frequency response curve 60 for the RF transformer 17 without the compensation transmission line 23 exhibits a rise of over 5 dB at 860 MHz. Accordingly, the return loss at 860 MHz is −13 dB.

To equalize the response characteristics, the compensation transmission line 23 is inserted to tune the frequency response. The effect of the compensating transmission line 23 is shown by the frequency response curve 62 of FIG. 3. The curve 62 shows a noticeable reduction in amplitude at 860 MHz and an overall flatter response across the design bandwidth of the RF amplifier. The use of the compensation transmission line 23 clearly ensures that this return loss is kept below the −18 dB reference line 64. It should be noted that the response characteristics shown in FIG. 3 is representative of one embodiment tuned for a specific application.

Figure 4:
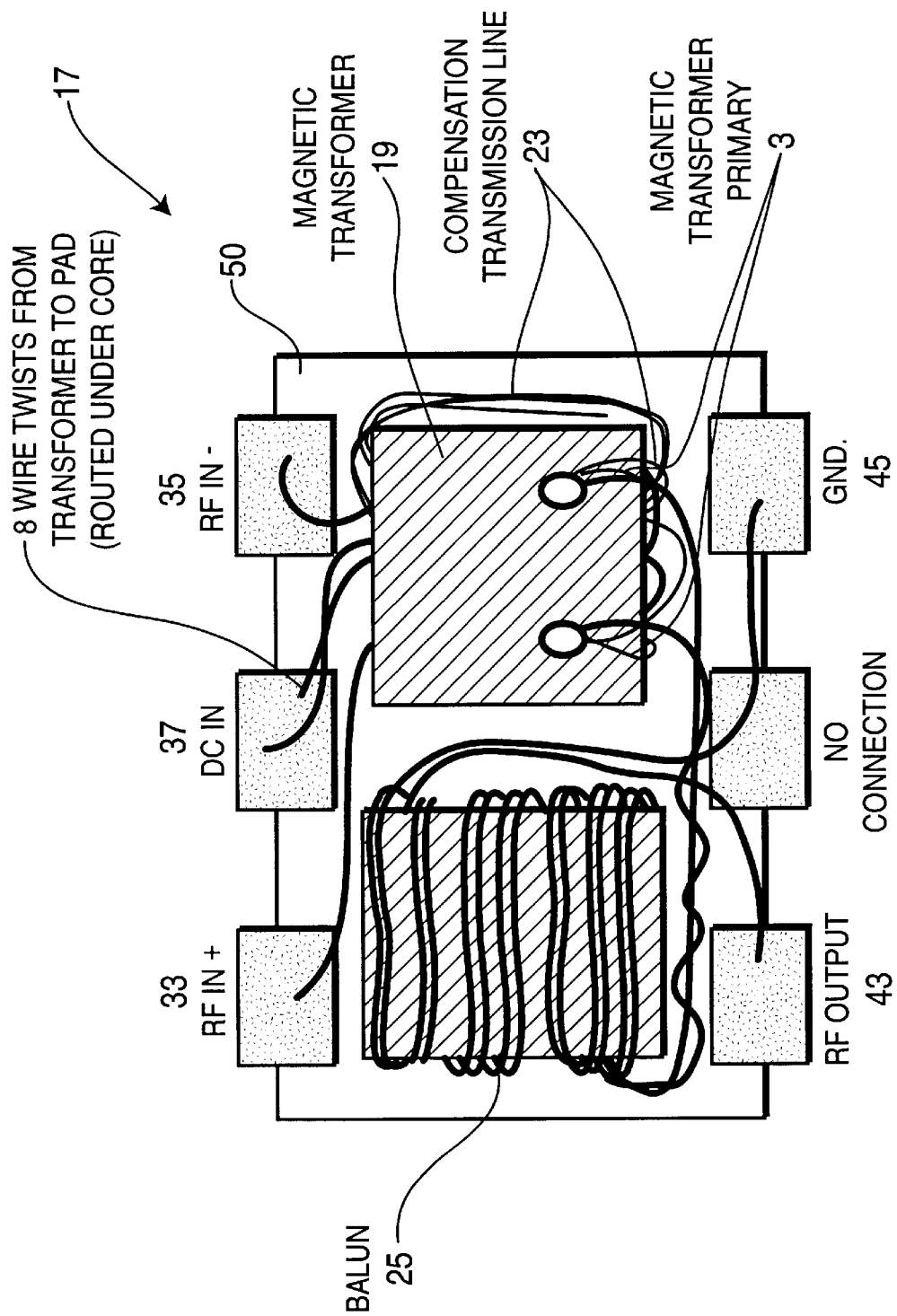
FIG. 4 is a top view of the entire preferred embodiment.

Physical realization of the simplicity of the RF transformer 17 likewise is shown in FIG. 4. The balun 25 is located adjacent to the magnetic transformer 19 upon a single substrate 50. This provides a compact and efficient utilization of space within a single package. The location of the compensation transmission line 23 is critical since improper placement may significantly degrade RF performance. The location of the compensation transmission line 23 is used to optimize the matching of the RF transformer 17 to an amplifier. Preferably, the compensation transmission line 23 is inserted through the core 39 of the magnetic transformer 19 and wrapped around a portion of the core 39, as shown in FIGS. 2 and 4. The compensation transmission line 23 could also be located around the periphery of the core 39 of the magnetic transformer 19. In this case, it would be preferable to include a groove (not shown) such that the compensation transmission line 23 is held securely in place.

Figure 5:
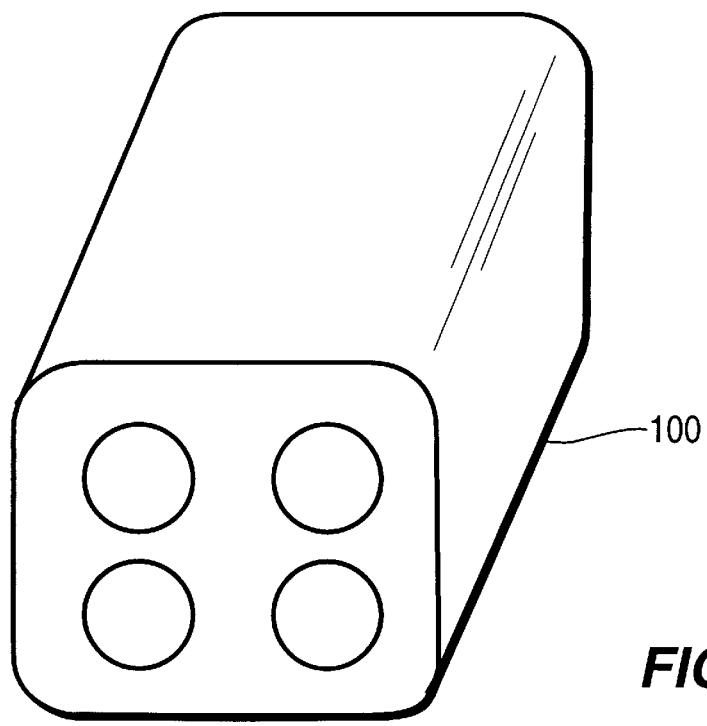
FIG. 5 is an alternative embodiment of the present invention.

It should be noted that alternative embodiments of the RF transformer 17 may use compensating transmission lines 23 constructed of coaxial cable. Additionally, physical construction of each transformer 19, 25 may include toroids, rods, or symmetric cores of powered iron or ferrite. For example, as shown in FIG. 5, a multi-hole (greater than 2) core 100 may be utilized to combine the transformer core 39 of the magnetic transformer 19 with the ferrite core 41 of the balun 25. This is particularly desirable for applications which require a compact design, since only a single core 100 is utilized.

What is claimed is:

1. An RF transformer having a balanced RF input and an unbalanced RF output comprising:

a magnetic transformer for receiving a balanced RF input signal and generating a balanced RF output signal;

a balun forreceiving the balanced RF output signal from the magnetic transformer and for outputting an unbalanced RF output signal; and a compensation transmission line, comprising a pair of selectively spaced conductive elements, coupled in shunt between said magnetic transformer and said balun.

2. An RF transformer having a balanced RF input and an unbalanced RF output comprising:

a magnetic transformer for receiving a balanced RF input signal and generating a balanced RF output signal;

a balun for receiving the balanced RF output signal from the magnetic transformer and for outputting an unbalanced RF output signal; and a compensation transmission line shunted across balanced nodes between said magnetic transformer and said balun, whereby said compensation transmission line has a length which matches the impedance of said magnetic transformer with said balun.

3. The RF transformer of claim 2 whereby the magnetic transformer further includes two output terminals for coupling the magnetic transformer to the balun.

4. The RF transformer of claim 3 whereby the compensation transmission line further includes two input terminals, and each said input terminal is coupled to a respective one of said output terminals.

5. The RF transformer of claim 2 wherein said magnetic transformer comprises a center-tapped transformer.

6. The RF transformer of claim 2 whereby the compensation transmission line comprises a twisted wire pair.

7. The RF transformer of claim 2 whereby the compensation transmission line comprises a coaxial cable.

8. The RF transformer of claim 2 wherein the magnetic transformer and the balun further include common magnetic core.

9. An RF transformer:

a magnetic transformer;

a balun, coupled to said magnetic transformer; and a compensation transmission line shunted across balanced nodes between said magnetic transformer and said balun, whereby said compensation transmission line has a length which matches the impedance of said magnetic transformer with said balun.

10. The RF transformer of claim 9 wherein the magnetic transformer and the balun further include a common magnetic core.

11. The RF transformer of claim 9 whereby the magnetic transformer further includes two output terminals for coupling the magnetic transformer to the balun.

12. The RF transformer of claim 11 whereby the compensation transmission line further includes two respective input terminals, and each said input terminal is coupled to one of said output terminals.

13. The RF transformer of claim 9 wherein said magnetic transformer comprises a center-tapped transformer.

14. The RF transformer of claim 9 whereby the compensation transmission line comprises a twisted wire pair.

\* \* \* \* \*

UNITED STATES PATENT AND TRADEMARK OFFICE
CERTIFICATE OF CORRECTION

| | | |
|---|---|---|
| PATENT NO. | : 6,239,668 B1 | Page 1 of 1 |
| DATED | : May 29, 2001 | |
| INVENTOR(S) | : Rudolph Menna; Philip Miguelez | |

It is certified that error appears in the above-identified patent and that said Letters Patent is hereby corrected as shown below:

<u>Title page,</u>
OTHER PUBLICATIONS, insert the following additional publications: -- Sevick, Transmission Line Transformers, 3rd Edition, pp. 1-1 to 1-11. Abrie, "The Design of Impedance - Matching Networks for Radio - Frequency and Microwave Amplifiers," Chapter 5, pp. 125-147 --.

<u>Column 4,</u>
Line 50, delete "forreceiving" and insert therefor -- for receiving --.

Signed and Sealed this

Twelfth Day of March, 2002

Attest:

JAMES E. ROGAN
Attesting Officer         Director of the United States Patent and Trademark Office